United States Patent
Noll et al.

(10) Patent No.: US 11,263,842 B2
(45) Date of Patent: Mar. 1, 2022

(54) METHOD FOR PREVENTING SECURITY BREACHES OF A PASSIVE REMOVE KEYLESS ENTRY SYSTEM

(71) Applicant: Aptiv Technologies Limited, St. Michael (BB)

(72) Inventors: Diethelm Noll, Birkenbeul (DE); Stefan Hupertz, Olpe (DE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 16/446,714

(22) Filed: Jun. 20, 2019

(65) Prior Publication Data

US 2020/0020184 A1 Jan. 16, 2020

(30) Foreign Application Priority Data

Jul. 11, 2018 (EP) ..................................... 18183012

(51) Int. Cl.
*G05B 19/00* (2006.01)
*G05B 23/00* (2006.01)
(Continued)

(52) U.S. Cl.
CPC ........ *G07C 9/00309* (2013.01); *B60R 25/245* (2013.01); *H03L 7/0805* (2013.01);
(Continued)

(58) Field of Classification Search
CPC ...... G07C 9/00309; G07C 2009/00333; G07C 2009/00539; G07C 2009/00555; G07C 2209/64; B60R 25/245; H03L 7/0805
See application file for complete search history.

(56) References Cited

U.S. PATENT DOCUMENTS 7,978,049 B2 * 7/2011 Leitch ..................... G01S 13/76
340/5.72
9,566,945 B2 2/2017 Ghabra et al.
(Continued)

FOREIGN PATENT DOCUMENTS

CN 106161421 11/2016
CN 108216121 6/2018
(Continued)

OTHER PUBLICATIONS

Ahmad et al., Modelling received signal strength from on-vehicle BLE beacons using skewed distributions—A preliminary study (Year: 2017).*
(Continued)

*Primary Examiner* — Quang Pham
(74) *Attorney, Agent, or Firm* — Colby Nipper PLLC

(57) ABSTRACT

The present invention relates to a method for preventing security breaches of a passive remote keyless entry system for authorizing access to a vehicle. The passive remote keyless entry system comprises a base station located at the vehicle and a mobile device, in particular a remote key, wherein the base station comprises a first processor unit and a first transceiver unit, the first transceiver unit comprises a timing device, the mobile device comprises a second processor unit and a second transceiver unit, an air travel time T of a single message sent back and forth from the base station to the mobile device is measured, and access to the vehicle is granted depending on the measured air travel time T.

14 Claims, 4 Drawing Sheets

(51) Int. Cl.
<table>
<tr><td>G06F 7/00</td><td>(2006.01)</td></tr>
<tr><td>G06F 7/04</td><td>(2006.01)</td></tr>
<tr><td>G06K 19/00</td><td>(2006.01)</td></tr>
<tr><td>G08B 29/00</td><td>(2006.01)</td></tr>
<tr><td>G08C 19/00</td><td>(2006.01)</td></tr>
<tr><td>H04B 1/00</td><td>(2006.01)</td></tr>
<tr><td>H04B 1/38</td><td>(2015.01)</td></tr>
<tr><td>H04B 3/00</td><td>(2006.01)</td></tr>
<tr><td>H04Q 1/00</td><td>(2006.01)</td></tr>
<tr><td>H04Q 9/00</td><td>(2006.01)</td></tr>
<tr><td>G07C 9/00</td><td>(2020.01)</td></tr>
<tr><td>B60R 25/24</td><td>(2013.01)</td></tr>
<tr><td>H03L 7/08</td><td>(2006.01)</td></tr>
</table>

(52) U.S. Cl.
CPC .............. G07C 2009/00333 (2013.01); G07C 2009/00539 (2013.01); G07C 2009/00555 (2013.01); G07C 2209/64 (2013.01)

(56) References Cited

U.S. PATENT DOCUMENTS

| | | | |
|---|---|---|---|
| 9,911,259 B1* | 3/2018 | Ghabra | G07C 9/28 |
| 10,649,061 B2* | 5/2020 | Bjorkengren | H04W 4/029 |
| 2001/0033222 A1* | 10/2001 | Nowottnick | H04W 12/122 |
| | | | 340/5.61 |
| 2002/0024460 A1 | 2/2002 | Ghosh et al. | |
| 2003/0043023 A1* | 3/2003 | Perraud | G06K 7/0008 |
| | | | 340/10.1 |
| 2003/0117295 A1* | 6/2003 | Okada | B60R 25/24 |
| | | | 340/12.23 |
| 2006/0083406 A1* | 4/2006 | Ishimura | B60R 25/24 |
| | | | 382/106 |
| 2006/0094350 A1* | 5/2006 | Ishimura | G01S 13/751 |
| | | | 455/9 |
| 2008/0048827 A1* | 2/2008 | Nakasato | B60R 25/2027 |
| | | | 340/5.61 |
| 2008/0100417 A1* | 5/2008 | Hata | B60R 25/04 |
| | | | 340/5.72 |
| 2008/0106375 A1* | 5/2008 | Nakajima | B60R 25/245 |
| | | | 340/5.72 |
| 2008/0143500 A1* | 6/2008 | Ghabra | B60R 25/24 |
| | | | 340/426.36 |
| 2008/0244757 A1* | 10/2008 | Nakagaki | B60R 25/241 |
| | | | 726/28 |
| 2009/0091423 A1* | 4/2009 | Nagaoka | B60R 25/24 |
| | | | 340/5.72 |
| 2009/0102623 A1* | 4/2009 | Tatebayashi | B60R 25/24 |
| | | | 340/426.14 |
| 2009/0264082 A1* | 10/2009 | Tieman | G01S 5/12 |
| | | | 455/73 |
| 2009/0265071 A1* | 10/2009 | Isaji | B60W 30/16 |
| | | | 701/70 |
| 2010/0007550 A1* | 1/2010 | Nagamiya | G01C 21/165 |
| | | | 342/357.24 |
| 2010/0286912 A1* | 11/2010 | Inoue | G01S 19/48 |
| | | | 701/470 |
| 2011/0143668 A1* | 6/2011 | Farrell | H04M 1/6091 |
| | | | 455/41.2 |
| 2011/0218709 A1* | 9/2011 | Hermann | B60R 25/24 |
| | | | 701/45 |
| 2011/0221633 A1* | 9/2011 | Schramm | G01S 13/767 |
| | | | 342/394 |
| 2012/0032855 A1* | 2/2012 | Reede | G01S 13/82 |
| | | | 342/458 |
| 2012/0268242 A1 | 10/2012 | Tieman et al. | |
| 2013/0237189 A1* | 9/2013 | Nishidai | H04W 12/06 |
| | | | 455/411 |
| 2014/0215567 A1* | 7/2014 | Yoshizawa | H04W 12/122 |
| | | | 726/3 |
| 2014/0308971 A1* | 10/2014 | O'Brien | H04W 4/023 |
| | | | 455/456.1 |
| 2014/0327517 A1* | 11/2014 | Portet | G07C 9/20 |
| | | | 340/5.61 |
| 2014/0330449 A1* | 11/2014 | Oman | B60R 25/01 |
| | | | 701/2 |
| 2014/0340193 A1* | 11/2014 | Zivkovic | G07C 9/00309 |
| | | | 340/5.61 |
| 2015/0015367 A1 | 1/2015 | Lin | |
| 2015/0074805 A1* | 3/2015 | Choi | H04L 63/0853 |
| | | | 726/22 |
| 2015/0120085 A1* | 4/2015 | Sanji | B60R 25/00 |
| | | | 701/1 |
| 2015/0166075 A1* | 6/2015 | Nam | B60R 25/2072 |
| | | | 701/2 |
| 2015/0184628 A1* | 7/2015 | Fan | B60R 25/24 |
| | | | 701/2 |
| 2015/0291129 A1* | 10/2015 | Saito | G06F 21/35 |
| | | | 455/411 |
| 2016/0001742 A1* | 1/2016 | Miyazawa | G07C 9/00309 |
| | | | 701/2 |
| 2016/0075307 A1* | 3/2016 | Jakobsson | B60R 25/31 |
| | | | 701/2 |
| 2016/0098870 A1* | 4/2016 | Bergerhoff | B60R 25/2018 |
| | | | 340/5.61 |
| 2016/0107611 A1 | 4/2016 | Siswick et al. | |
| 2016/0200291 A1* | 7/2016 | Kim | H04W 12/06 |
| | | | 701/2 |
| 2016/0267734 A1* | 9/2016 | Hamada | G07C 9/00309 |
| 2016/0267735 A1* | 9/2016 | Hamada | G07C 9/00309 |
| 2016/0332598 A1* | 11/2016 | Ghabra | B60R 25/245 |
| 2017/0026910 A1* | 1/2017 | Scheim | H04W 52/0245 |
| 2017/0190317 A1* | 7/2017 | Hamada | G01S 3/28 |
| 2017/0192086 A1* | 7/2017 | Hamada | H04B 17/318 |
| 2017/0298659 A1* | 10/2017 | Watanabe | E05B 77/48 |
| 2017/0352206 A1* | 12/2017 | Nagata | G07C 9/20 |
| 2017/0366521 A1* | 12/2017 | Lei | H04W 4/14 |
| 2018/0093642 A1* | 4/2018 | Casagrande | G06F 21/34 |
| 2018/0099643 A1* | 4/2018 | Golsch | G07C 9/00309 |
| 2018/0103354 A1* | 4/2018 | Lei | H04W 4/023 |
| 2018/0208155 A1* | 7/2018 | Beyer | B60R 25/045 |
| 2018/0232971 A1* | 8/2018 | Schieke | B60R 25/24 |
| 2018/0257604 A1* | 9/2018 | Komeya | H04L 63/102 |
| 2018/0302859 A1* | 10/2018 | Elangovan | H04B 17/318 |
| 2019/0005753 A1* | 1/2019 | Leconte | B60R 25/245 |
| 2019/0016301 A1* | 1/2019 | Merkel | G06K 9/00302 |
| 2019/0044712 A1* | 2/2019 | Hassan | H04L 9/0875 |
| 2019/0055756 A1* | 2/2019 | Ducka | E05F 15/77 |
| 2019/0130681 A1* | 5/2019 | Chin | B60R 25/245 |
| 2019/0230471 A1* | 7/2019 | Golgiri | G01S 5/00 |
| 2020/0020184 A1* | 1/2020 | Noll | G07C 9/00309 |

FOREIGN PATENT DOCUMENTS

| | | |
|---|---|---|
| EP | 1127755 A2 | 8/2001 |
| EP | 1650581 | 4/2006 |
| EP | 1978667 A2 | 10/2008 |
| EP | 1867535 B1 | 7/2017 |
| GN | 101076834 | 11/2007 |
| GN | 104299295 | 1/2015 |

OTHER PUBLICATIONS

Jimenez et al., Survey on Ranging Sensors and Cooperative Techniques for Relative Positioning of Vehicles (Year: 2017).*
Tiemann et al., CELIDON Supporting First Responders through (Year: 2020).*
Alrabady et al., Analysis of attacks against the security of keyless-entry systems for vehicles and suggestions for improved designs (Year: 2005).*
Bharati et al., Threats and Countermeasures of Cyber Security in Direct and Remote Vehicle Communication Systems (Year: 2020).*
Kim et al., Vehicle Relay Attack Avoidance Methods Using RF Signal Strength (Year: 2013).*
Lounis et al., Attacks and Defenses in Short-Range Wireless Technologies for IoT (Year: 2020).*
European Search Report for Application No. 18183012.6, European Patent Office, dated Jan. 8, 2019.

(56) References Cited

OTHER PUBLICATIONS

"Foreign Office Action", CN Application No. 201910613527.4, dated Jun. 23, 2021, 21 pages.

* cited by examiner

METHOD FOR PREVENTING SECURITY BREACHES OF A PASSIVE REMOVE KEYLESS ENTRY SYSTEM

CROSS-REFERENCE TO RELATED APPLICATION

This application claims the benefit under 35 U.S.C. § 119(a) of European Patent Application EP 18183012.6, filed Jul. 11, 2018, the entire disclosure of which is hereby incorporated herein by reference.

TECHNICAL FIELD

This disclosure generally relates to a method for preventing security breaches of a passive remote keyless entry system for authorizing access to a vehicle, the passive remote keyless entry system comprising a base station located at the vehicle and a mobile device, in particular a remote key.

BACKGROUND

Passive remote keyless entry (RKE) systems are intended to authorize access to a vehicle upon request by a driver. They can also be enabled to authorize a control of certain operations of the vehicle like starting an engine. Passive RKE systems usually comprise a base station located at the vehicle and a mobile device, in particular a remote key, carried along by the driver. Upon the driver requesting access to the vehicle, for example by pressing door handles of the vehicle, the base station and the mobile device exchange encrypted messages, including a request code issued by the base station and an access code issued by the mobile device. In case of a positive result of the authorization negotiations, access to the vehicle is granted and an access signal is sent to the vehicle.

Although the exchanged codes and their transmission are encrypted, manipulations of such passive RKE systems, in particular by so-called relay attacks, pose a growing problem. By intention, the mobile device has to be in the vicinity of the base station during an authorization process. This is achieved by a limited range of transceivers used for the exchange of messages between the mobile device and the base station. Consequently, there is a maximum distance between the mobile device and the base station for the authorization to be successful.

In a relay attack this maximum distance is increased by monitoring and forwarding the exchanged messages between the mobile device and the base station. In an illustrative example of a relay attack, a first thief, being located close to the vehicle, requests access to the vehicle, for example by pressing door handles. In response to the request, the base station sends a request code to the mobile device. The first thief monitors the transmission and forwards the transmission to a second thief, being located close to the driver and the mobile device. The second thief sends the forwarded request code to the mobile device, where an authorization is negotiated. Upon authorizing access to the vehicle, the mobile device sends an acceptance signal to the base station, which is monitored by the second thief and forwarded to the first thief. The first thief sends the forwarded acceptance signal to the base station which in turn grants access to the vehicle.

SUMMARY

Described herein are techniques to provide a method for preventing security breaches of a passive remote keyless entry system, which offers a high level of security, is economical and is easy to implement.

The method uses a base station comprising a first processor unit and a first transceiver unit, the first transceiver unit comprising a timing device, the mobile device comprising a second processor unit and a second transceiver unit, wherein an air travel time T of a single message sent back and forth from the base station to the mobile device is measured, and access to the vehicle is granted depending on the measured air travel time T.

The method includes determining the distance between the mobile device and the base station during an authorization process. If the distance exceeds a certain predetermined limit, access to the vehicle is refused, irrespective of a result of the authorization negotiations between the base station and the mobile device.

The distance between the mobile device and the base station is determined by measuring the air travel time T of a single message sent back and forth from the base station to the mobile device. As the message travels with a known velocity, namely the speed of light, the distance between the base station and the mobile device is directly connected to the measured air travel time T. An upper limit in an allowed distance between the base station and the mobile device therefore corresponds to an upper limit of the air travel time T.

Standard type processors are too slow to measure the air travel time T directly, as they neither include timing devices fast enough nor are able to achieve the high transmission rates necessary for an accurate determination of the air travel time T. High speed processors (DSP, FPGA) comprising fast timing devices do exist, but are too cost-intensive to be used in a passive RKE system. As the processors are not required for measuring the air travel time T and/or for transmitting the message, processor units and transceiver units are separated from each other.

The first processor unit and the first transceiver unit therefore are separate units connected by a data link. Also the second processor unit and the second transceiver unit are separate units connected by a data link. The timing device is separated from and not part of the first processor unit. As the measurement of the air travel time T is separated from the processor units, the processor units can be of standard type and have not to be high speed processors. This has the advantageous effect that the measurement of the air travel time T can be made cost-effective.

The air travel time T is measured by a timing device comprised in the first transceiver unit. The timing device can be part of the transmitter, the receiver, the first memory unit or the control unit of the first transceiver unit, or can be a separate unit in the first transceiver unit.

The first transceiver unit and the second transceiver unit can be included in the mobile device or the base station as application-specific integrated circuits (ASIC), comprising all components of the respective unit.

Advantageous embodiments are set forth in the dependent claims, in the description and in the figures.

In accordance with an advantageous embodiment of the invention, the first transceiver unit sends a start signal to the timing device at a time of sending a request message to the second transceiver unit, the first transceiver unit sends a stop signal to the timing device at a time of receiving a return message from the second transceiver unit, wherein the air travel time T is obtained as a time difference between the start signal and the stop signal. The start and the stop signal are sent simultaneously with the transmission of the request message and the reception of the return message, respectively. Thereby it is assured that the timing device can measure the air travel time T very accurately.

The first transceiver unit measures preferably the air travel time T with a time resolution equal to or better than five-hundred pico-seconds (500 ps), and more preferably with a time resolution equal or better than 100 ps. With this time resolution air travel times T can be measured very accurately, allowing the determination of distances between the base station and the mobile device as small as about fifteen centimeters (15 cm) and 3 cm, respectively.

In accordance with an embodiment of the invention, the base station authorizes the access to the vehicle by sending an access signal to the vehicle, in case the air travel time T is shorter than a predetermined time limit TL. In this way it will be ensured that access to the vehicle is granted only in case the mobile device is in the vicinity of the base station. Given a maximal allowed distance between the mobile device and the base station during an authorization process, the time limit TL can be chosen accordingly, using the known travel velocity of the signals, messages or codes between the base station and the mobile device.

In accordance with a further embodiment of the invention, the second transceiver unit further comprises a Phase-Locked-Loop oscillator (PLL), wherein the first transceiver unit broadcasts an activation signal to activate the PLL before sending the start signal to the timing device. The phase-locked loop increases the frequency of an oscillator by a factor, i.e. it shifts the frequency of the oscillator to higher values. It is therefore possible to use in the second transceiver unit transmitters emitting at lower frequencies, in particular transmitters emitting low frequency (LF) signals. As the energy consumption of LF transmitters is considerably lower than the energy consumption of high frequency (HF) transmitters, a supply unit for the second transceiver unit can be a simple battery. To reduce the energy consumption further, the PLL can be deactivated most of the time and can be active during a communication between the base station and the mobile device only. In this case, the PLL is activated by the activation signal sent by the first transceiver unit. The activation signal can be a short unencrypted wake-up message to the PLL. After a communication between the base station and the mobile device, i.e. between the first and second transceiver units has ended, the PLL is deactivated once again, for example by an internal sleep message sent by the second transceiver unit to the PLL.

The PLL can also be used to synchronize the base station and the mobile device, by synchronizing a phase of an oscillator's clock signal with an external timing signal. The synchronization is done by comparing and adjusting the phase of the external signal to the phase of the clock signal.

In accordance with an embodiment of the invention, the first transceiver unit comprises a PLL as well. In this way, also the energy consumption of the first transceiver during an authorization process can be reduced.

In accordance with an advantageous embodiment of the invention, the first processor unit generates an encrypted request code and the second processor unit generates an encrypted access code. In other words, the codes being used in an authorization process will preferably be encrypted and will include security codes. This makes it difficult to duplicate the codes and ensures that the authorization process is secure.

The request code can be generated as a request for access to the vehicle has been initiated by the driver, for example by actuation of an actuation device at the vehicle. The actuation device can for example include optical sensors, proximity sensors or sensors for detecting manual interaction. Preferably the access code is available already, as the request for access is initiated by the driver and the request code is generated. For example, the second processor unit can generate the access code immediately after a previous communication of the base station and the mobile device during a previous negotiation of an access to the vehicle.

The request message is preferably the encrypted request code. After the request code has been generated, the first processor unit can transfer the request code to the first transceiver unit via a data link, which then can send the request code immediately to the second transceiver unit. In this way a transmission of a separate, in particular unencrypted, request message can be omitted, saving energy during the authorization process and accelerating the communication and negotiation between the base station and the mobile device.

In accordance with an embodiment of the invention, the first transceiver unit further comprises a first memory unit and the second transceiver unit comprises a second memory unit, wherein the encrypted request code and the encrypted access code are stored in the second memory unit. The first memory unit and the second memory unit comprise preferably one or a plurality of registers, allowing a fast access to stored data.

In accordance with an embodiment of the invention, the second transceiver unit compares the encrypted request code and the encrypted access code and, in case of a match, sends an acceptance signal to the base station. In other words, all the decoding and comparison of the request and access codes takes place in the second transceiver unit, i.e. in the mobile device. The access code itself will not be transmitted to any other place and therefore will never leave the mobile device. This eliminates the possibility of an unlawful interception during a transmission and increases the security of the inventive method.

As an encryption of the acceptance signal is not necessary, the acceptance signal is preferably an unencrypted and/or short acknowledgement message. In this way, the data volume to be transmitted can be kept at a minimum, which reduces the energy consumption of the second transceiver unit and enhances the life time of its supply unit. Obviously, the acceptance signal can be encrypted as well, if desired.

In accordance with a further embodiment of the invention, the method further includes the determination of a distance D between the base station and the mobile device during the authorization process, comprising the step of calculating a reduced time interval $TD=(T-TC4-TC5-TC6-TC7)/2$, wherein TC4 is a time interval required to send the request code, TC5 is a time interval required to receive and store the request code and compare it with the access code, TC6 is a time interval required to send the acceptance signal, TC7 is a time interval required to receive the acceptance signal, and the step of calculating the distance $D=(TD/33.3 \text{ ps})$ cm.

Whereas T is the measured time difference between the start signal and the stop signal, TC4, TC6 and TC7 can be calculated from known sizes of the transmitted messages or codes and known clock frequencies of the first and second transceiver units. Similarly, TC5 can be calculated from the known sizes of the compared messages or codes and the known clock frequency of the second transceiver unit.

Thus, the reduced time interval TD is the run time of a signal propagating at the speed of light between the base station and the mobile device. It relates to the distance D via $D=(TD/33.3 \text{ ps})$ cm, with a conversion factor of 33.3 ps reflecting a time interval in which light travels a distance of 1 cm. These calculations assume that the distance D between the mobile device and the base station stays constant during an authorization process.

The base station authorizes preferably the request for access and sends the access signal to the vehicle in case the distance D between the base station and the mobile device is less than a maximum allowed distance $DL=(TL/33.3\text{ ps})$ cm between the base station and the mobile device. DL is a predetermined value and is selected in way to ensure that the mobile device is in the vicinity of the base station for an access to the vehicle to be granted by the base station. The access signal can be short and unencrypted message sent by the first transceiver unit to the vehicle.

The present invention also relates to a passive remote keyless entry system for authorizing access to a vehicle, capable of performing the inventive method, comprising a base station to be located at the vehicle and a mobile device, in particular a remote key, wherein the base station comprises a first processor unit, a first transceiver unit and a data link between the first processor unit and the first transceiver unit, the mobile device comprises a second processor unit, a second transceiver unit and a data link between the second processor unit and the second transceiver unit, the first transceiver unit comprises a transmitter, a receiver, a first memory unit, a control unit and a timing device, and wherein the second transceiver unit comprises a transmitter, a receiver, a second memory unit and a control unit.

The first processor unit and the first transceiver unit are separate units connected by a data link. Also the second processor unit and the second transceiver unit are separate units connected by a data link. The timing device is separated from and not part of the first processor unit. The timing device can be part of the transmitter, the receiver, the first memory unit or the control unit of the first transceiver unit, or can be a separate unit in the first transceiver unit.

In accordance with an embodiment of the passive remote keyless entry system, the second transceiver unit further comprises a Phase-Locked-Loop oscillator (PLL). By the PLL, frequencies of oscillators of the second transceiver unit are shifted to higher values. The PLL can also enable a synchronization of the base station and the mobile device.

Preferably, the timing device is a Time to Digital Converter (TDC), in particular with a time resolution equal or better than 500 ps, more preferably equal or better than 100 ps. Thus, the distance D between the base station and the mobile device can be measured very accurately, with a resolution of about 15 cm and 3 cm, respectively. Thereby the maximum allowed distance DL between base station and mobile device can be chosen such that only the mobile device being located in the immediate vicinity of the vehicle can lead to an authorized access to the vehicle.

In accordance with an embodiment of the passive remote keyless entry system, the transmitter of the second transceiver unit emits low frequency (LF) signals. The operation of LF transmitter requires significantly less energy than the operation of higher frequency transmitters, in particular HF transmitters. The LF transmitters therefore can increase the lifetime of the supply unit of the mobile device, reducing the risk of a power failure, for example caused by a worn-out battery. Further features and advantages will appear more clearly on a reading of the following detailed description of the preferred embodiment, which is given by way of non-limiting example only and with reference to the accompanying drawings.

BRIEF DESCRIPTION OF DRAWINGS

Further details will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
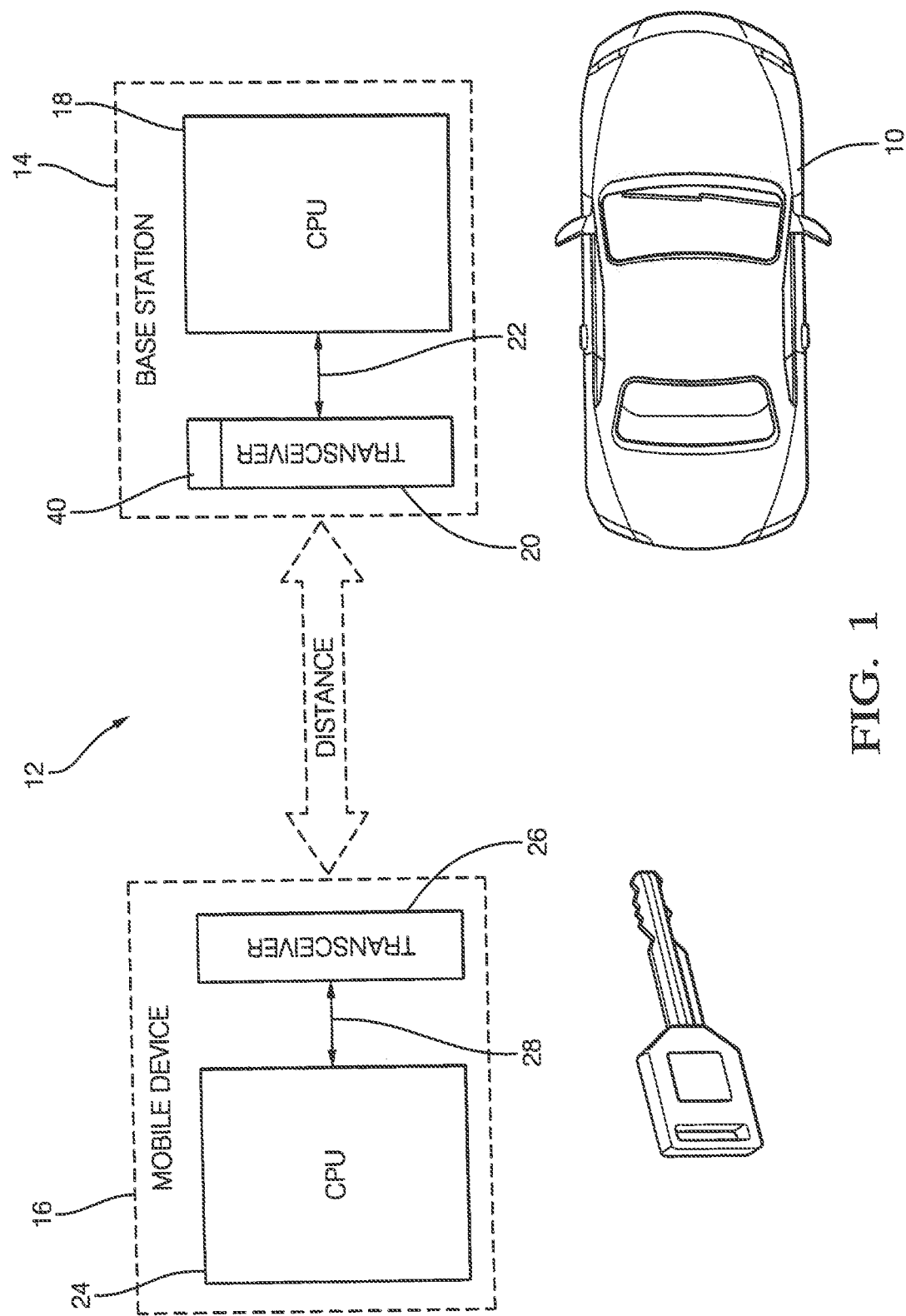
FIG. 1 is a schematic view of an embodiment of a passive remote keyless entry system.

FIG. 1 shows a schematic view of an embodiment of an inventive passive remote keyless entry (RKE) system 12. The passive RKE system 12 comprises a base station 14 to be located at a vehicle 10 and a mobile device 16, in particular a remote key, which for example can be carried along by a driver (not shown). The base station 14 comprises a first processor unit 18, a first transceiver unit 20 and a data link 22 between the first processor unit 18 and the first transceiver unit 20. The mobile device 16 comprises a second processor unit 24, a second transceiver unit 26 and a data link 28 between the second processor unit 24 and the second transceiver unit 26.

Figure 2:
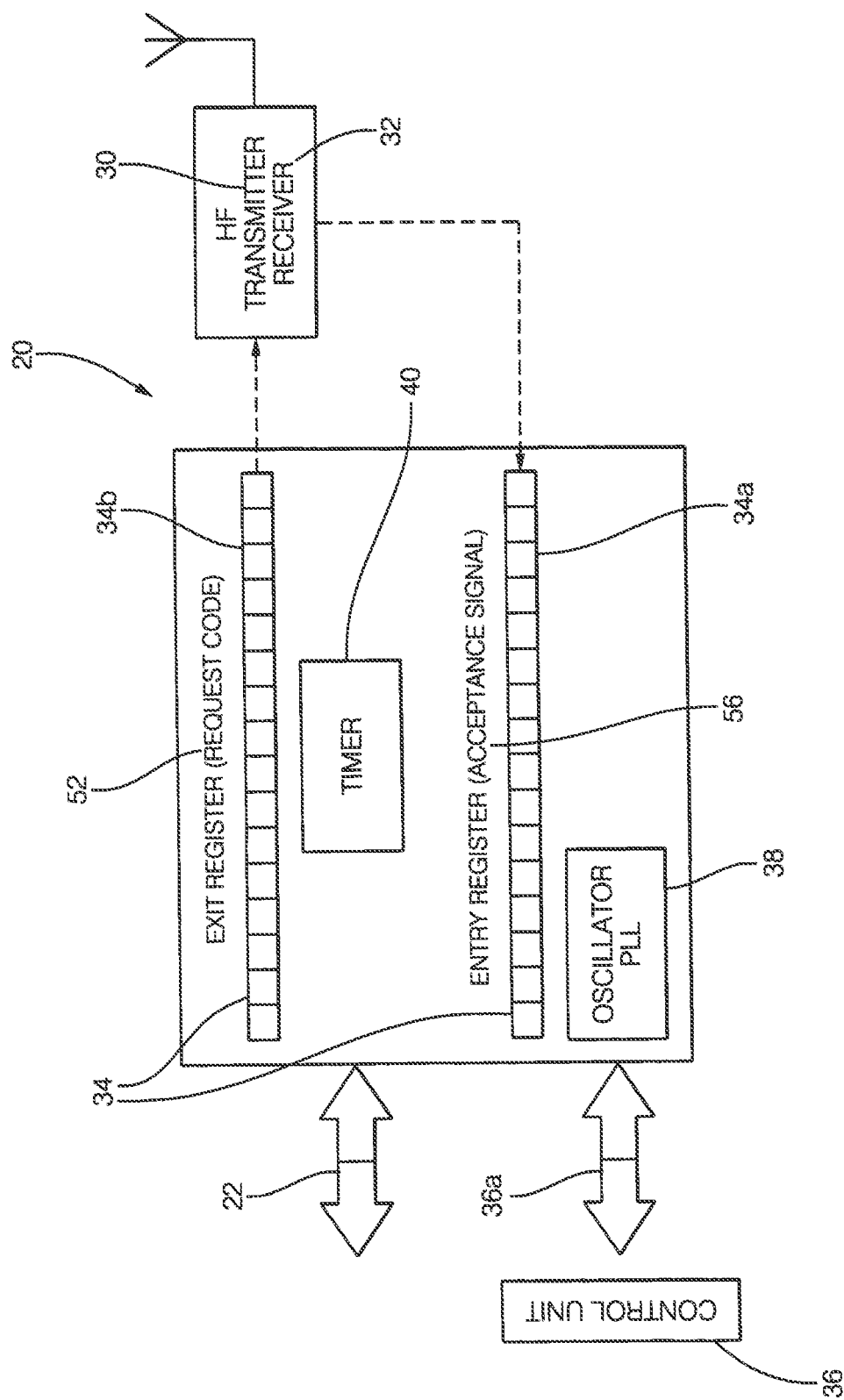
FIG. 2 is a schematic view of the first transceiver unit of the embodiment of FIG. 1.

In FIG. 2 a schematic view of the first transceiver unit 20 is shown in greater detail. The first transceiver unit 20 comprises a transmitter 30, a receiver 32, a first memory unit 34, a control unit 36, a PLL oscillator 38 and a timing device (timer) 40. The first memory unit 34 is made up by two registers and includes an entry register 34a and an exit register 34b. The first transceiver unit 20 and the control unit 36 are connected by a control interface 36a.

Figure 3:
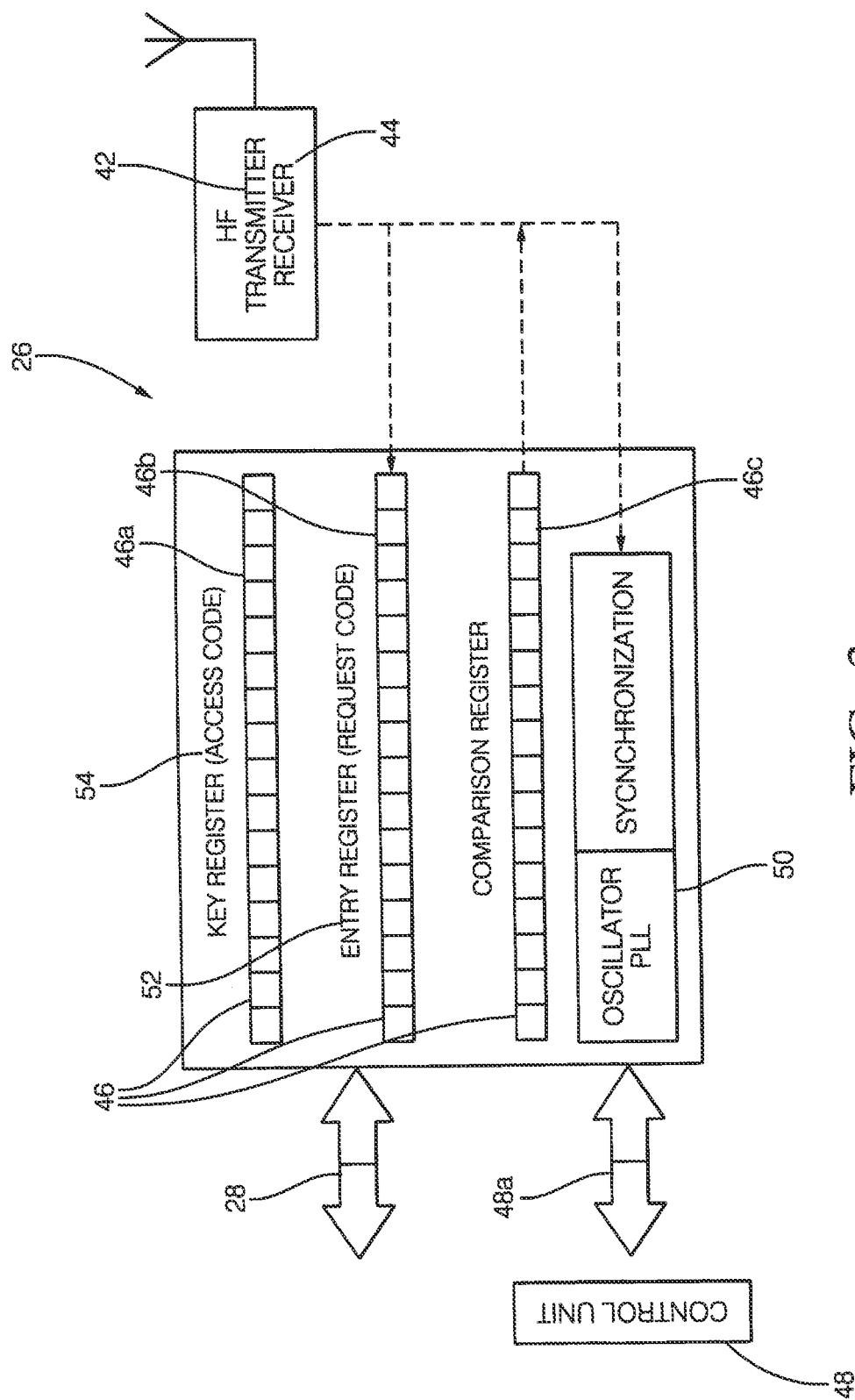
FIG. 3 is a schematic view of the second transceiver unit of the embodiment of FIG. 1.

FIG. 3 shows a schematic view of the second transceiver unit 26 in greater detail. The second transceiver unit 26 comprises a transmitter 42, a receiver 44, a second memory unit 46, a control unit 48 and a PLL oscillator 50. The second memory unit 46 is made up by three registers and includes a key register 46a, an entry register 46b and a comparison register 46c. The second transceiver unit 26 and the control unit 48 are connected by a control interface 48a.

The first transceiver unit 20 and the second transceiver unit 26 can be included in the base station 14 or the mobile device 16 as application-specific integrated circuit (ASIC), comprising all components of the respective transceiver unit 20, 26.

Figure 4:
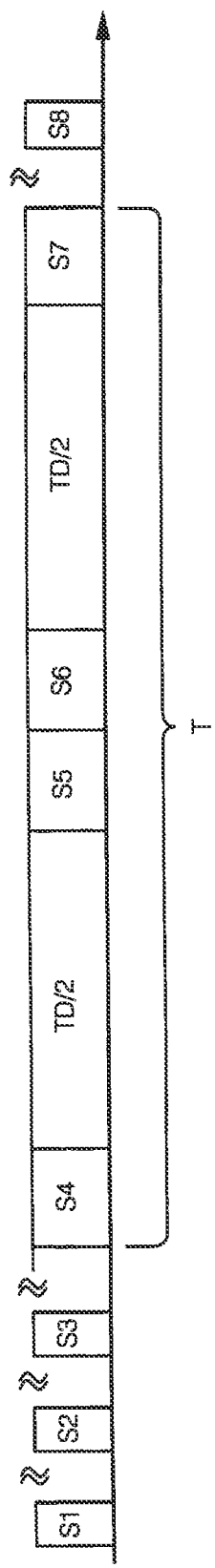
FIG. 4 is a flowchart representing an embodiment of a method for preventing security breaches of the passive remote keyless entry system of FIG. 1.

In FIG. 4 a flowchart of the inventive method for preventing security breaches of a passive RKE system is shown, comprising the steps S1 to S8. All steps of the inventive method, including the steps S1 to S8, are controlled by the control units 36 and 48 of the first and second transceiver units 20 and 26.

In step S1 a driver requests access to the vehicle, for example by actuation of an actuation device (not shown) at the vehicle 10. The actuation device can include optical sensors, proximity sensors or sensors for detecting manual interaction. For example, the request for access can be initiated by pressing a dedicated button at the vehicle or by pressing a door handle.

As the request for access is initiated by the driver in step S1, an encrypted request code 52 is generated by the first processor unit 18 and forwarded to the first transceiver unit 20 in step S2. The first transceiver unit 20 receives the request code 52 via the data link 22 from the first processor unit 18 and stores the code 52 in the entry register 34a of the first memory unit 34.

Similarly to the first processor unit 18, the second processor unit 24 generates an encrypted access code 54 and stores the code 54 in the key register 46a of the second memory unit 46. The access code 54 can be generated and be available already, as the request for access is initiated by the driver and the request code 52 is generated. For example, the second processor unit 24 can generate the access code 54 immediately after a previous communication of the base station 14 and the mobile device 16 during a previous negotiation of an access to the vehicle 10.

In step S3, the first transceiver unit 20 sends an activation signal to the PLL oscillator 50 of the second transceiver unit 26. The activation signal can be a short unencrypted message to wake-up the PLL 50. As the PLL is only needed during a communication between the base station 14 and the mobile device 16, the PLL 50 is deactivated most of the time to reduce the energy consumption of the second transceiver unit 26. After a communication between the first and second transceiver unit 20, 26 has ended in step S7, the PLL 50 is deactivated once again, for example by an internal sleep message sent by the second transceiver unit 26 to the PLL 50.

The PLL 50 has the effect of increasing the frequency of an oscillator by a factor, shifting the frequencies of an oscillator for example from the low frequency (LF) to the high frequency (HF) range. This is used in the shown embodiment to shift the emitted frequencies of the LF transmitter 42 to the HF range. By the combination of the PLL 50 and a LF transmitter 42 it is possible to operate the second transceiver unit 26 in an energy-efficient and cost-effective way.

The PLL 50 is also used to synchronize the base station 14 and the mobile device 16. This is done by synchronizing a phase of a clock signal of the second transceiver unit with an external timing signal from the base station 14.

In the shown embodiment, a PLL 38 is also included in the first transceiver unit 20.

In step S4 the first transceiver unit 20 sends the request code 52 to the second transceiver unit. A time TC4 to finish the transmission is calculated from a known size of the transmitted request code 52 and a known clock frequency of the first transceiver unit 20.

Simultaneously with starting the transmission of the request code 52, the first transceiver unit 20 sends a start signal to the timing device 40, which does not form part of the first processor unit 18. The timing device 40 is for example a Time to Digital Converter (TDC), with a preferred time resolution of e.g. 500 ps, advantageously of equal or better than 100 ps. This time resolution allows measuring a distance D between the base station 14 and the mobile device 16 very accurately, with a resolution of about 15 cm and 3 cm, respectively.

Upon reception, the second transceiver unit 26 stores in step S5 the request code 52 in an entry register 46b of the second memory unit 46 and compares the request code 52 with the access code 54 in an comparison register 46c of the second memory unit 46. A time TC5 to finish the reception and storage of the request code 52 and its comparison with the access code 54 is calculated from known sizes of the request code 52 and the access code 54 and the known clock frequency of the second transceiver unit 26.

In case of a match of the request code 52 and the access code 54, an acceptance signal 56 is sent from the second transceiver unit 26 to the first transceiver unit 20 in step S6. The acceptance signal 56 can be an encrypted or an unencrypted message or code, preferably it is an unencrypted short acknowledgment message of known length. A time TC6 to finish the transmission is calculated from a known size of the acceptance signal 56 and the known clock frequency of the second transceiver unit 26.

Immediately after the acceptance signal 56 has been fully received and has been stored in the entry register 34a of the first memory unit 34, the first transceiver unit sends a stop signal to the timing device 40 in step S7. A time TC7 to finish the reception is calculated from the known size of the acceptance signal 56 and the known clock frequency of the first transceiver unit 20.

In step S8, an air travel time T is obtained as a time difference between the start signal (see step S4) and the stop signal (see step S7). As the start and the stop signal are sent simultaneously with the transmission of the request code 52 and the reception of the acceptance signal 56, it is assured that the air travel time T is determined very accurately.

In a final step, the distance D between the base station 14 and the mobile device 16 during the authorization process is determined. This includes the calculation of a reduced time interval TD=(T−TC4−TC5−TC6−TC7)/2, wherein T is the measured air travel time, TC4 is the time interval required to send the request code 52 (see step S4), TC5 is a time interval required to receive and store the request code 52 and compare it with the access code 54 (see step S5), TC6 is the time interval required to send the acceptance signal (see step S6) and TC7 is the time interval required to receive the acceptance signal (see step S7).

From the reduced time interval a distance D between the mobile device 16 and the base station 14 is calculated according to D=(TD/33.3 ps) cm. These calculations assume that the distance D between the mobile device 16 and the base station 14 stays constant during an authorization process.

In case the distance D between the base station 14 and the mobile device 16 is less than a predetermined maximum allowed distance between the base station 14 and the mobile device 16, the base station 14 authorizes the request for access and sends an access signal to the vehicle 10.

While this invention has been described in terms of the preferred embodiments thereof, it is not intended to be so limited, but rather only to the extent set forth in the claims that follow.

We claim:

1. A method, comprising:
   preventing security breaches of a passive remote keyless entry system configured for authorizing access to a vehicle, the preventing the security breaches comprising:
   storing, in a register of a first transceiver unit of a base station of the vehicle, an encrypted request code generated in response to an actuation of an actuation device of the vehicle;
   measuring, by a first processor unit of the base station, an air travel time of messages exchanged with a remote key, the measuring the air travel time comprising:
   sending, to a timing device of the base station, a start signal;
   sending, from the register of the first transceiver unit of the base station and to a first register of a second transceiver unit of the remote key, the encrypted request code;
   responsive to sending the encrypted request code, receiving, from the second transceiver unit, an unencrypted acceptance signal generated by a second processor unit of the remote key, the unencrypted acceptance signal generated based on a match-comparison of a first and second registers of the second transceiver unit,
   the first register of the second transceiver unit of the remote key being where the encrypted request code received from the first transceiver unit is stored, and the second register of the second transceiver unit of the remote key being where an encrypted access code generated by the second transceiver unit of the remote key is maintained;
   responsive to receiving, from the second transceiver unit of the remote key, the unencrypted acceptance signal generated by the second transceiver unit of the remote key;
   storing, in a second register of the first transceiver unit of the base station, the unencrypted acceptance signal; and
   sending, to the timing device of the first transceiver unit of the base station, a stop signal; and
   determining, by the first processor unit of the base station and based on a time difference between the sending of the start signal and the sending of the stop signal, the air travel time, the air travel time including a combination of:
   a time interval required for the first transceiver unit of the base station to send the encrypted request code;
   a time interval required for the second processor unit of the remote key to execute the match-comparison of the first and second registers of the second transceiver unit to generate the unencrypted acceptance signal in response to the first transceiver unit of the base station sending the encrypted request code; and
   a time interval required for the second transceiver unit of the remote key to send, and for the first transceiver unit of the base station to receive, the unencrypted acceptance signal; and
   responsive to the first processor unit of the base station authorizing, based the air travel time being shorter than a predetermined time limit, the actuation of the actuation device, sending, by the first transceiver unit of the base station, and to the vehicle, an access signal for authorizing access to the vehicle using the actuation device.

2. The method of claim 1, wherein sending the start signal to the timing device of the first transceiver unit of the base station occurs at a time of sending the encrypted request code to the first register of the second transceiver unit of the remote key.

3. The method of claim 1, wherein sending the stop signal to the timing device of the base station occurs at a time of receiving the unencrypted acceptance signal from the second transceiver unit of the remote key.

4. The method of claim 1, The method further comprising: determining, based on the air travel time, a distance between the base station and the remote key; determining whether the distance is shorter than a maximum distance for authorizing access to the vehicle; and sending, by the first transceiver unit of the base station, the access signal to the vehicle for authorizing access to the vehicle further in response to determining that the distance is shorter than the maximum distance for authorizing access to the vehicle.

5. The method of claim 1, wherein the register of the first transceiver unit of the base station comprises an entry register where the encrypted request code is stored, and the second register of the first transceiver unit of the base station comprise an exit register where the unencrypted acceptance signal is stored.

6. The method of claim 5, further comprising:
   storing, by the first processor unit of the base station, in the entry register of the first transceiver unit of the base station, the encrypted request code; and
   obtaining, by the first processor unit of the base station, from the exit register of the first transceiver unit of the base station, the unencrypted acceptance signal.

7. The method of claim 1, wherein sending the stop signal to the timing device of the base station comprises sending the stop signal immediately in response to receiving the unencrypted acceptance signal.

8. The method of claim 7, wherein sending the stop signal immediately in response to receiving the unencrypted acceptance signal comprises sending the stop signal within five hundred picoseconds or less from sending the start signal.

9. A system comprising:
   a base station of a vehicle configured to prevent security breaches of a passive remote keyless entry system of the vehicle by authorizing access to the vehicle, the base station comprising a timing device, a first transceiver unit, and a first processor unit, the base station being configured to prevent the security breaches by:

storing, in a register of the first transceiver unit, an encrypted request code generated in response to an actuation of an actuation device of the vehicle, the encrypted request code being generated as a request for access to the vehicle is initiated;

measuring an air travel time of messages exchanged with a remote key, the measuring the air travel time comprising:

sending, to the timing device of the base station, a start signal;

sending, to a second transceiver unit of the remote key, the encrypted request code; and responsive to sending the encrypted request code, receiving, from the second transceiver unit of the remote key, an unencrypted acceptance signal generated by a second processor unit of the remote key and based on a match-comparison of a first and a second registers of the second transceiver unit of the remote key, the first register of the second transceiver unit of the remote key configured to store the encrypted request code received from the first transceiver unit of the base station, and the second register of the second transceiver unit of the remote key configured to maintain an encrypted access code generated by the second transceiver unit of the remote key;

responsive to receiving the unencrypted acceptance signal from the second transceiver unit of the remote key:

storing, in another register of the first transceiver unit of the base station, the unencrypted acceptance signal; and sending, to the timing device of the base station, a stop signal; and determining, based on a time difference between the sending of the start signal and the sending of the stop signal, the air travel time including a combination of:

a time interval required to send the encrypted request code;

a time interval required to receive and store the encrypted request code and compare the encrypted request code with the encrypted access code generated by the second transceiver unit of the remote key;

a time interval required to send the unencrypted acceptance signal; and a time interval required to receive the unencrypted acceptance signal; and responsive to authorizing, based the air travel time being short than a predetermined time limit, the actuation of the actuation device, sending, by the first transceiver unit of the base station an access signal for authorizing access to the vehicle using the actuation device.

10. The system of claim 9, wherein the start signal is sent to the timing device of the base station at a time when the encrypted request code is sent to the second transceiver unit of the remote key.

11. The system of claim 9, wherein the stop signal is sent to the timing device of the base station at a time when the unencrypted acceptance signal is received from the second transceiver unit of the remote key.

12. The system of claim 9, wherein the base station is further configured to prevent the security breaches further by:

determining, based on the air travel time, a distance between the base station and the remote key; and determining whether the distance is shorter than a maximum distance for authorizing access to the vehicle; and sending the access signal to the vehicle for authorizing access to the vehicle further in response to determining that the distance is shorter than the maximum distance for authorizing access to the vehicle.

13. The system of claim 9, wherein the base station is configured to prevent the security breaches further by sending the stop signal to the timing device of the base station immediately in response to receiving the unencrypted acceptance signal.

14. The system of claim 13, wherein the base station is configured to send the stop signal immediately in response to receiving the unencrypted acceptance signal by sending the stop signal within five hundred picoseconds or less from sending the start signal.

* * * * *